US012648438B2

(12) United States Patent
Ting et al.

(10) Patent No.: US 12,648,438 B2
(45) Date of Patent: Jun. 2, 2026

(54) ELECTRONIC DEVICE AND MANUFACTURING METHOD THEREOF

(71) Applicant: Innolux Corporation, Miao-Li County (TW)

(72) Inventors: Chin-Lung Ting, Miao-Li County (TW); Liang-Lu Chen, Miao-Li County (TW); Kuang-Ming Fan, Miao-Li County (TW); Chia-Lin Yang, Miao-Li County (TW); Chun-Hung Chen, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 587 days.

(21) Appl. No.: 17/828,039

(22) Filed: May 31, 2022

(65) Prior Publication Data

US 2023/0178452 A1     Jun. 8, 2023

(30) Foreign Application Priority Data

Dec. 3, 2021     (CN) .......................... 202111469562.7

(51) Int. Cl.
*H10W 40/22*          (2026.01)
*H10P 74/00*          (2026.01)
(Continued)

(52) U.S. Cl.
CPC ......... *H10W 40/228* (2026.01); *H10P 74/273* (2026.01); *H10W 40/037* (2026.01);
(Continued)

(58) Field of Classification Search
CPC ....... H01L 23/367–3677; H01L 23/485; H01L 23/49822; H01L 23/522; H01L 23/5226;
(Continued)

(56) References Cited

U.S. PATENT DOCUMENTS 5,506,755 A * 4/1996 Miyagi ............... H01L 23/3677
                                                              361/720
2019/0139854 A1* 5/2019 Wu .................... H01L 23/53209

FOREIGN PATENT DOCUMENTS

CN          103190082 A * 7/2013 ........... H01L 23/552
CN          108028225       5/2018
(Continued)

OTHER PUBLICATIONS

"Office Action of Taiwan Counterpart Application", issued on Jun. 4, 2024, pp. 1-8.
(Continued)

*Primary Examiner* — Zandra V Smith
*Assistant Examiner* — Molly K Reida
(74) *Attorney, Agent, or Firm* — JCIPRNET

(57)          ABSTRACT

An electronic device and a manufacturing method thereof are disclosed. The electronic device includes a connector, an electronic component, and a heat sink. The connector has at least one conductive structure and at least one first heat dissipation structure. The at least one conductive structure and the at least one first heat dissipation structure are physically separated and electrically insulated from each other. The electronic component is electrically connected to the at least one conductive structure. The heat sink is connected to the at least one first heat dissipation structure. The heat sink and the electronic component are disposed on opposite sides of the connector.

18 Claims, 9 Drawing Sheets

(51) Int. Cl.
  *H10W 40/00*    (2026.01)
  *H10W 70/09*    (2026.01)
  *H10W 70/60*    (2026.01)
  *H10W 70/652*   (2026.01)

(52) U.S. Cl.
  CPC ............ H10W 70/09 (2026.01); *H10W 70/60*
    (2026.01); *H10W 70/6528* (2026.01)

(58) Field of Classification Search
  CPC ............ H01L 23/5283; H01L 23/5383; H01L
    23/5386; H10W 40/22–242; H10W
      70/60–699
  See application file for complete search history.

(56)          References Cited

FOREIGN PATENT DOCUMENTS

| | | | | |
|---|---|---|---|---|
| CN | 207783246 | 8/2018 | | |
| TW | 200608864 | 3/2006 | | |
| TW | I431735 | 3/2014 | | |
| TW | 201436130 | 9/2014 | | |
| TW | 201913923 | 4/2019 | | |
| TW | 201936016 | 9/2019 | | |
| TW | I682508 | 1/2020 | | |
| WO | WO-03081669 A1 * | 10/2003 | ............. | H01L 24/96 |

OTHER PUBLICATIONS

"Office Action of Taiwan Counterpart Application", issued on May 22, 2023, p. 1-p. 8.

* cited by examiner

ELECTRONIC DEVICE AND MANUFACTURING METHOD THEREOF

CROSS-REFERENCE TO RELATED APPLICATION

This application claims the priority benefit of Chinese application no. 202111469562.7, filed on Dec. 3, 2021. The entirety of the above-mentioned patent application is hereby incorporated by reference herein and made a part of this specification.

BACKGROUND

Technical Field

The disclosure relates to an electronic device and a manufacturing method thereof. In particular, the disclosure relates to an electronic device and a manufacturing method thereof, which improves the heat dissipation or reduces the size.

Description of Related Art

Electronic devices, or tiled electronic devices, have been widely applied in different fields such as communications, displaying, lighting, sensor, vehicle, or aviation. The development of electronic devices is vigorous and in the meantime trends toward thinness and lightness, and results in increasing requirements for reliability or quality of electronic devices.

SUMMARY

The disclosure provides an electronic device and a manufacturing method thereof, which improves the heat dissipation or reduces the size.

According to an embodiment of the disclosure, an electronic device includes a connector, an electronic component, and a heat sink. The connector has at least one conductive structure and at least one first heat dissipation structure. The at least one conductive structure and the at least one first heat dissipation structure are physically separated and electrically insulated from each other. The electronic component is electrically connected to the at least one conductive structure. The heat sink is connected to the at least one first heat dissipation structure. The heat sink and the electronic component are disposed on opposite sides of the connector.

According to an embodiment of the disclosure, a manufacturing method of an electronic device includes the following. First, a connector is formed. The connector has at least one conductive structure and at least one first heat dissipation structure. The at least one conductive structure and the at least one first heat dissipation structure are physically separated and electrically insulated from each other. Next, an electronic component is disposed to be electrically connected to the at least one conductive structure. Next, a heat sink is formed to be connected to the at least one first heat dissipation structure. The heat sink and the electronic component are disposed on opposite sides of the connector.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
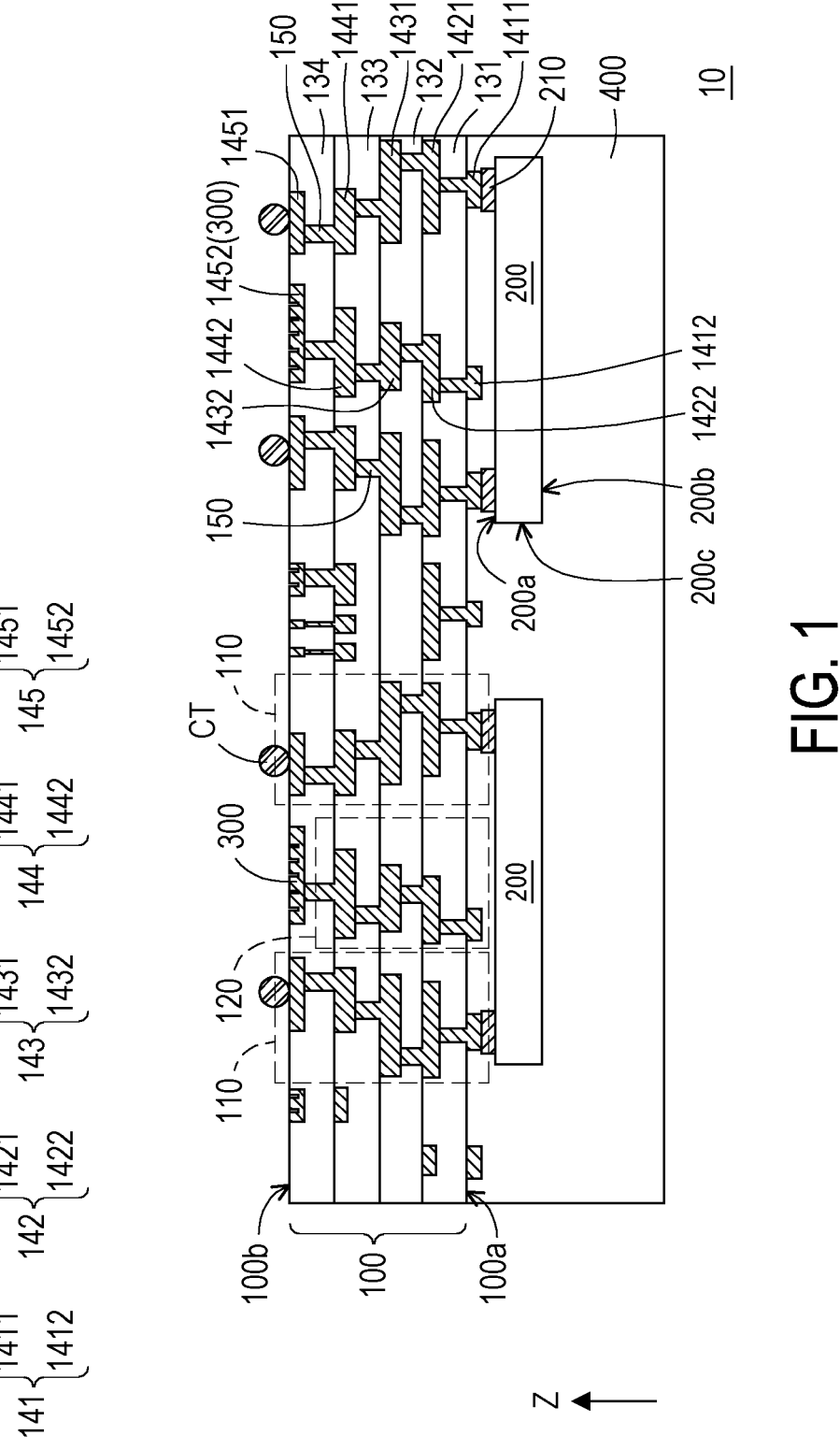
FIG. 1 is a schematic partial cross-sectional view of an electronic device according to an embodiment of the disclosure.

The disclosure may be understood with reference to the following detailed description together with the accompanying drawings. It should be noted that, for ease of understanding by readers and conciseness of the drawings, a plurality of drawings in the disclosure merely show a part of an electronic device, and specific elements in the drawings are not drawn to scale. In addition, the number and size of the elements in the drawings only serve for exemplifying instead of limiting the scope of the disclosure.

In the following description and claims, terms such as "include", "comprise", and "have" are open-ended terms, and thus should be interpreted as "including, but not limited to".

It should be understood that when an element or film layer is referred to as being "on", or "connected to" another element or film layer, the element or film layer may be directly on or connected to the another element or film layer, or intervening elements or film layers may also be present in between (non-direct circumstances). In contrast, when an element or film layer is referred to as being "directly on" or "directly connected to" another element or film layer, no intervening elements or film layers are present in between.

Although terms such as "first", "second", "third", etc. may be used to describe diverse constituent elements, such constituent elements are not limited by the terms. The terms are used only to discriminate a constituent element from other constituent elements in the specification. In the claims, the terms first, second, third, etc. may be used in accordance with the order of claiming an element instead of using the same terms. Accordingly, in the following description, a first constituent element may be a second constituent element in the claims.

Herein, the term "about", "approximately", "substantially", or "essentially" typically represents that a value is within 10% of a given value or range, or within 5%, 3%, 2%, 1%, or 0.5% of a given value or range. The given value here is an approximate value, namely implicitly meaning "about," "approximately", "substantially", or "essentially" without specifically indicating the terms "about," "approximately", "substantially", or "essentially".

In some embodiments of the disclosure, terms related to bonding and connection such as "connection", "interconnection", etc., unless specifically defined, may indicate the case where two structures are in direct contact, or where two structures are not in direct contact and other structures are disposed in between. Moreover, such terms related to bonding and connection may also cover the case where two structures are both movable or where two structures are both fixed. In addition, the term "coupling" includes any direct and indirect electrical connection means.

In some embodiments of the disclosure, an optical microscopy (OM), a scanning electron microscope (SEM), a thin film thickness profiler (α-step), an ellipsometer, or other suitable manner may be used to measure an area, a width, a thickness, or a height of each element or measure a distance or a spacing between elements. To be specific, according to some embodiments, a SEM may be used to obtain a cross-sectional structural image including elements to be measured, and measure an area, a width, a thickness, or a height of each element or measure a distance or a spacing between elements.

The electronic device of the disclosure may include, but is not limited to, a display device, a packaging device, a semiconductor packaging device, a backlight device, an antenna device, a sensing device, or a tiled device. The electronic device may be a bendable or flexible electronic device. The display device may be a non-self-luminous display device or a self-luminous display device. The antenna device may be a liquid crystal form antenna device or a non-liquid crystal form antenna device. The sensing device may be a sensing device for sensing capacitance, light, heat, or ultrasonic waves, but not limited thereto. The electronic component may include a passive element and an active element, such as a capacitor, a resistor, an inductor, a diode, a transistor, or the like. The diode may include a light emitting diode or a photodiode. The light emitting diode (LED) may include an organic LED (OLED), a mini LED, a micro LED, or a quantum dot LED, for example but not limited thereto. The tiled device may include a tiled display device or a tiled antenna device, for example but not limited thereto. It should be noted that the electronic device may be any arrangement and combination of the above, but not limited thereto. Hereinafter, an electronic device will be adopted to describe the disclosure.

It should be understood that features in several different embodiments below may be replaced, recombined, mixed with each other to achieve other embodiments without departing from the spirit of the disclosure. The features in the embodiments may be arbitrarily used in mixture or combination without departing from the spirit of the disclosure or conflicting with each other.

Reference will now be made in detail to the exemplary embodiments of the disclosure, examples of which are illustrated in the accompanying drawings. Wherever possible, the same reference numerals are used in the drawings and description to denote the same or like parts.

FIG. 1 is a schematic partial cross-sectional view of an electronic device according to an embodiment of the disclosure. With reference to FIG. 1, an electronic device 10 of this embodiment includes a connector 100, an electronic component 200, a heat sink 300, and a package structure 400. The connector 100 may be a redistribution layer (RDL). The redistribution layer RDL is, for example but not limited to, a redistribution circuit for achieving a high-density integrated circuit (IC), chip or electronic components. The connector 100 may include metal lines, metal layers, or insulating layers alternated and stacked with each other. The connector 100 may include transistors and capacitance, but not limited thereto. The connector 100 has a first surface 100a, a second surface 100b opposite to the first surface 100a, at least one conductive structure 110, and at least one first heat dissipation structure 120. The conductive structure and the first heat dissipation structure may be formed by stacking some of the metal lines and some of the metal layers, for example but not limited thereto.

Specifically, the connector 100 includes a plurality of insulating layers 131, 132, 133, and 134 (four layers are schematically taken as an example in FIG. 1, but not limited thereto), a plurality of circuit layers 141, 142, 143, 144, and 145 (five layers are schematically taken as an example in FIG. 1, but not limited thereto) and a plurality of first openings 150. The plurality of circuit layers 141, 142, 143, 144, and 145 and the plurality of insulating layers 131, 132, 133, and 134 are stacked in a sequence of the circuit layer 141, the insulating layer 131, the circuit layer 142, the insulating layer 132, the circuit layer 143, the insulating layer 133, the circuit layer 144, the insulating layer 134, and the circuit layer 145 from the first surface 100a to the second surface 100b. The plurality of first openings 150 penetrate the insulating layer 131, the insulating layer 132, the insulating layer 133, and the insulating layer 134. The circuit layer 141 and the circuit layer 142, the circuit layer 142 and the circuit layer 143, the circuit layer 143 and the circuit layer 144, and the circuit layer 144 and the circuit layer 145 may be connected to each other through the plurality of first openings 150, but not limited thereto. The material of the circuit layers 141, 142, 143, 144 and 145 may be, for example but not limited to, titanium, copper, aluminum, molybdenum, silver, other suitable metals, or an alloy or a combination of the above materials.

More specifically, in this embodiment, the first surface 100a may be deemed as a surface of the insulating layer 131 away from the insulating layer 134. The second surface 100b may be deemed as a surface of the insulating layer 134 away from the insulating layer 131. The circuit layer 141 is disposed on the first surface 100a and located outside the insulating layer 131, the circuit layer 142 is embedded in the insulating layer 131, the circuit layer 143 is embedded in the insulating layer 132, the circuit layer 144 is embedded in the insulating layer 133, the circuit layer 145 is embedded in the insulating layer 134 and exposed outside the second surface 100b. The metal pads are exposed outside the surface for electrically connected to other electronic components or for heat dissipation, but not limited thereto. In other words, the circuit layers may be disposed in the openings of the insulating layers, or the circuit layers may be connected to each other through the openings of the insulating layers. The circuit layer 141 may include a plurality of first metal pads 1411 and a plurality of first metal pads 1412, and the first metal pads 1411 and the first metal pads 1412 are physically separated and electrically insulated from each other. The circuit layer 142 may include a plurality of second metal pads 1421 and a plurality of second metal pads 1422, and the second metal pads 1421 and the second metal pads 1422 are physically separated and electrically insulated from each other. The circuit layer 143 may include a plurality of third metal pads 1431 and a plurality of third metal pads 1432, and the third metal pads 1431 and the third metal pads 1432 are physically separated and electrically insulated from each other. The circuit layer 144 may include a plurality of fourth metal pads 1441 and a plurality of fourth metal pads 1442, and the fourth metal pads 1441 and the fourth metal pads 1442 are physically separated and electrically insulated from each other. The circuit layer 145 may include a plurality of fifth metal pads 1451 and a plurality of fifth metal pads 1452, and the fifth metal pads 1451 and the fifth metal pads 1452 are physically separated and electrically insulated from each other.

In this embodiment, the at least one conductive structure 110 may include the first metal pad 1411, the second metal pad 1421, the third metal pad 1431, the fourth metal pad 1441, the fifth metal pad 1451, and part of the first opening 150. The at least one first heat dissipation structure 120 may include the first metal pad 1412, the second metal pad 1422, the third metal pad 1432, the fourth metal pad 1442, and part of the first opening 150. In addition, the at least one conductive structure 110 and the at least one first heat dissipation structure 120 are physically separated from each other, and the at least one conductive structure 110 and the at least one first heat dissipation structure 120 are electrically insulated from each other.

In this embodiment, the electronic component 200 has a third surface 200*a*, a fourth surface 200*b*, a surrounding surface 200*c*, and a pad 210. The third surface 200*a* and the fourth surface 200*b* are opposite to each other. The surrounding surface 200*c* connects the third surface 200*a* and the fourth surface 200*b*. The pad 210 is disposed on the third surface 200*a*. The electronic component 200 may be bonded to the first metal pad 1411 of the connector 100 through the pad 210 to dispose the electronic component 200 on the first surface 100*a* and electrically connect the electronic component 200 to the at least one conductive structure 110. According to some embodiments, the pad 210 is not in contact with the first metal pad 1412 of the first heat dissipation structure 120. In this embodiment, the first metal pad 1412 of the first heat dissipation structure 120 is not in contact with the third surface 200*a*, but not limited thereto. According to some embodiments, the first metal pad 1412 of the first heat dissipation structure 120 may be in contact with the third surface 200*a*. In addition, in this embodiment, the electronic component 200 may be overlapped with one of the at least one first heat dissipation structure 120 in a normal direction Z of the package structure 400, but not limited thereto.

In this embodiment, a surface of the fifth metal pad 1452 away from the first surface 100*a* is carved into a fin-like structure by laser cutting to manufacture the fifth metal pad 1452 into the heat sink 300. The heat sink 300 (the fifth metal pad 1452) is disposed on the second surface 100*b* and exposed outside the second surface 100*b*. The heat sink 300 is embedded in the insulating layer 134 and exposed outside the second surface 100*b*. According to some embodiments, a surface of the heat sink 300 may be substantially aligned with the second surface 100*b*. In other words, the absolute value of the height difference between the surface of the heat sink 300 and the second surface 100*b* in the normal direction Z of the package structure 400 is less than or equal to 3 millimeters (mm), but not limited thereto. The heat sink 300 (the fifth metal pad 1452) and the electronic component 200 are respectively located on opposite sides of the connector 100. For example, in one embodiment, the heat sink 300 is overlapped with the electronic component 200 in the normal direction Z of the package structure 400, but not limited thereto. In one embodiment, it is also possible that the heat sink 300 is not overlapped with the electronic component 200 in the normal direction Z of the package structure 400. In other words, the heat sink 300 and the electronic component 200 may be overlapped or non-overlapped with each other when the heat sink 300 and the electronic component 200 are located on opposite sides of the connector 100. The heat dissipation path of the electronic device 10 of this embodiment is described in, but not limited to, the following example. First, heat in the electronic component 200 and heat in the conductive structure 110 may be transferred to the first heat dissipation structure 120 by heat radiation or heat conduction, for example. Next, since the heat sink 300 may be in contact with the circuit layer of the first heat dissipation structure 120, the heat may subsequently be transferred to the heat sink 300 by thermal conduction, for example. Next, since the heat sink 300 is exposed outside the second surface 100*b*, or the heat sink 300 is coplanar with the second surface 100*b*, the heat of the electronic device 10 may be transferred from the heat sink 300 to the exterior by thermal convection or thermal radiation, for example, to achieve heat dissipation. In other words, the first heat dissipation structure 120 may be adapted to transfer heat in the electronic component 200 and heat in the conductive structure 110 to the heat sink 300, and the heat sink 300 may be adapted to transfer heat to the exterior. In addition, in this embodiment, by providing the first heat dissipation structure 120 and the heat sink 300, and disposing the heat sink 300 and the electronic component 200 on opposite sides of the connector 100, the heat dissipation path can be increased and heat generated by the electronic component 200 can be dissipated to improve the overall heat dissipation efficiency, but not limited thereto.

In addition, in this embodiment, since the surface of the heat sink 300 away from the first surface 100*a* may be designed as a fin-like structure, the heat sink 300 may be a heat dissipation fin to increase the heat dissipation area of the heat sink 300 and improve the overall heat dissipation efficiency. Moreover, in this embodiment, since the fifth metal pad 1452 of the circuit layer 145 in the connector 100 may be designed as the heat sink 300, the configuration of the heat sink 300 may be integrated in the connector 100, and relatively large heat dissipation devices or heat dissipation plates are not required to be additionally disposed at other locations, reducing the overall size of the electronic device 10. For example, the thickness of the electronic device 10 can be reduced, but not limited thereto. In one embodiment, the heat sink 300 may be same layer as the fifth metal pad 1451. That is, the heat sink 300 and the fifth metal pad 1451 are formed by same metal layer, but not limited thereto. In one embodiment, the heat sink 300 and the fifth metal pad 1451 are formed by different metal layers, but not limited thereto.

In this embodiment, the package structure 400 is disposed on the first surface 100*a* and surrounds the electronic component 200. The package structure 400 may be disposed in the gap between the third surface 200*a* and the first surface 100*a*. The package structure 400 may be in contact with the third surface 200*a*, the fourth surface 200*b*, and the surrounding surface 200*c* of the electronic component 200. The material of the package structure 400 may be resin, epoxy resin, organosilicon compounds, or other suitable packaging materials, but not limited thereto.

In this embodiment, the electronic device 10 may further include a conductive terminal CT. The conductive terminal CT is disposed on a surface of the fifth metal pad 1451 away from the first surface 100*a*, and the conductive terminal CT may be adapted to be bonded to other electronic components, such as an IC chip (not shown), a printed circuit board (not shown), a capacitor (not shown), or other suitable elements during subsequent manufacturing processes. In this embodiment, the conductive terminal CT may be a solder ball, but not limited thereto.

In this embodiment, a manufacturing method of the electronic device 10 may be an RDL-first manufacturing method, including but not limited to the following. First, a release layer is formed on a carrier (not shown). The material of the release layer may be a thermal tape. The material of the carrier may include glass, quartz, sapphire, ceramic, stainless steel, silicon wafer, package structure (e.g., resin, epoxy resin, organosilicon compounds), other suitable substrate materials, or a combination of the above, but not limited thereto. Next, the connector 100 is formed on the release layer. Next, the release layer and the carrier are removed by laser lift-off (LLO), heating, or other suitable manners, for example, to expose the second surface 100*b* of the connector 100 and the fifth metal pad 1452. Next, after being flipped upside down, the surface of the fifth metal pad 1452 away from the first surface 100*a* is carved into a fin-like structure by laser cutting, for example, to form the heat sink 300 on the second surface 100*b* of the connector 100 and expose the heat sink 300 outside the second surface 100*b*. Next, the electronic component 200 is disposed on the first surface 100*a* of the connector 100 to electrically connect the electronic component 200 to the at least one conductive structure 110. Next, the package structure 400 is formed on the first surface 100*a* to surround the electronic component 200. Next, the conductive terminal CT is formed on the fifth metal pad 1451 of the circuit layer 145, so that the electronic device 10 of this embodiment can be bonded to other electronic components such as an IC chip and/or a printed circuit board during subsequent manufacturing processes. So far, manufacturing of the electronic device 10 of this embodiment has been substantially completed.

Other embodiments will be provided below for description. It should be noted here that the reference numerals and partial content of the above embodiments remain to be used in the following embodiments, where the same reference numerals are used to denote the same or like elements, and the description of the same technical content is omitted. Reference may be made to the above embodiments for the description of the omitted part, which will not be repeated in the following embodiments.

Figure 2:
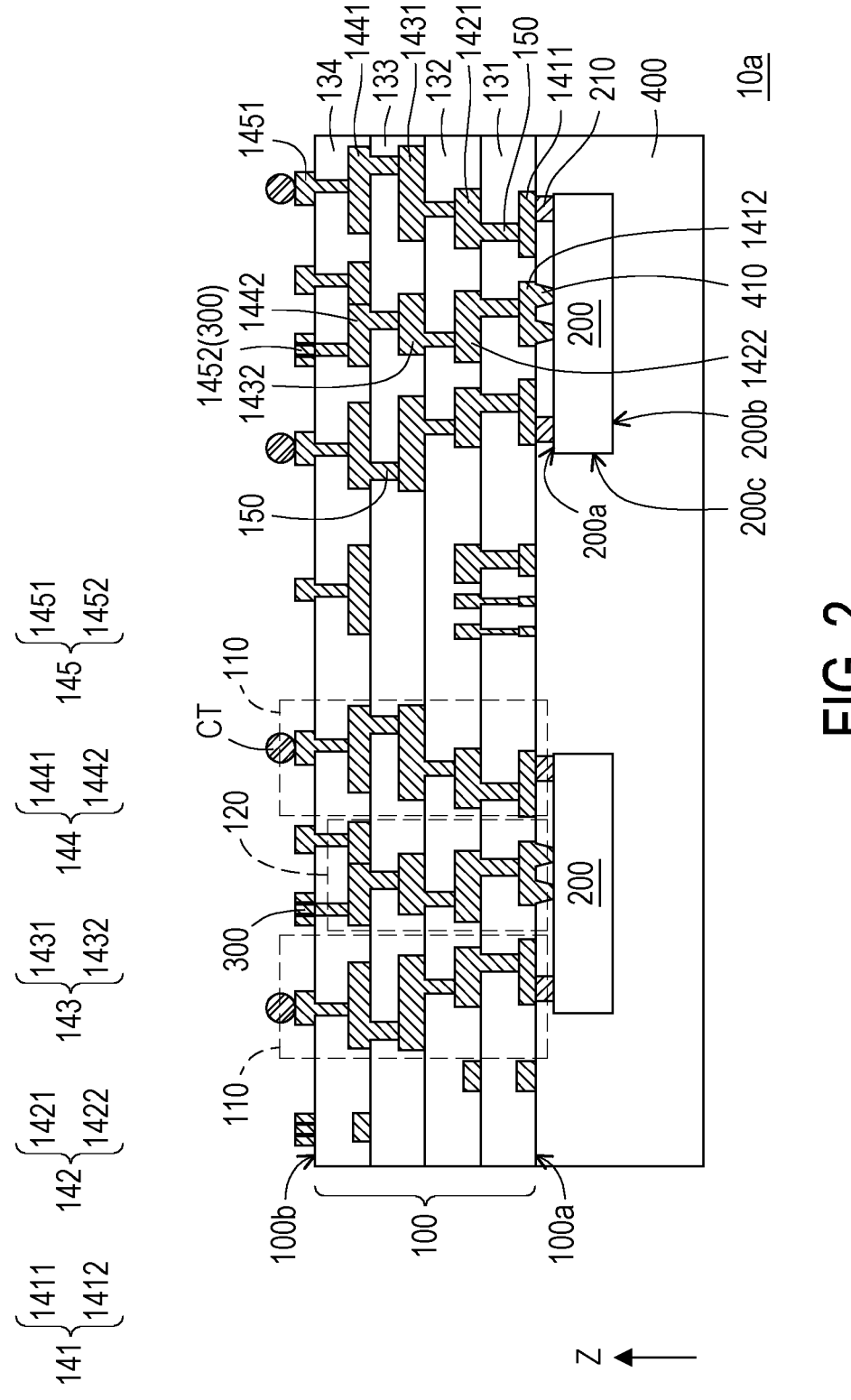
FIG. 2 is a schematic partial cross-sectional view of an electronic device according to another embodiment of the disclosure.

FIG. 2 is a schematic partial cross-sectional view of an electronic device according to another embodiment of the disclosure. With reference to FIG. 1 and FIG. 2 together, an electronic device 10*a* of this embodiment is similar to the electronic device 10 in FIG. 1, while the difference between them is that the electronic device 10*a* of this embodiment further includes a second opening 410. The first opening and the second opening referred to in the disclosure may be formed by laser drilling or mechanical drilling, for example but not limited thereto.

Specifically, with reference to FIG. 2, the circuit layer 141 in the connector 100 is embedded in the insulating layer 131 and exposed outside the first surface 100*a*, the circuit layer 142 is embedded in the insulating layer 132, the circuit layer 143 is embedded in the insulating layer 133, the circuit layer 144 is embedded in the insulating layer 134, the circuit layer 145 is disposed on the second surface 100*b* and located outside the insulating layer 134. Since the fifth metal pad 1452 of the circuit layer 145 is located outside the insulating layer 134, the surface of the fifth metal pad 1452 away from the first surface 100*a* may be etched into a fin-like structure by lithography etching, for example, to manufacture the fifth metal pad 1452 into the heat sink 300.

The second opening 410 is disposed between the connector 100 and the electronic component 200. The second opening 410 may be disposed at the package structure 400 between the connector 100 and the electronic component 200. In other words, the second opening 410 may expose part of the electronic component 200. In this embodiment, conductive materials in the first heat dissipation structure 120 may extend through the second opening 410 and may be in contact with the electronic component 200. For example, at least one first heat dissipation structure 120 may be in contact with a portion of a surface of the electronic component. Therefore, the first heat dissipation structure 120 may be in contact with the electronic component 200, and the heat sink 300 may be connected to the electronic component 200 through the plurality of circuit layers of the first heat dissipation structure 120 and the second opening 410. Accordingly, heat in the electronic component 200 may not only be transferred to the first heat dissipation structure 120 by heat radiation, but may also be transferred to the first heat dissipation structure 120 by heat conduction, improving the heat dissipation efficiency of the electronic component 200. The conductive materials disposed in the second opening 410 may be, for example but not limited to, titanium, copper, aluminum, molybdenum, silver, other suitable metals, or an alloy or a combination of the above materials.

In addition, in this embodiment, a manufacturing method of the electronic device 10*a* may be a chip-first/face-down manufacturing method, including but not limited to the following. First, a carrier (not shown) is provided. The material of the carrier may include silicon wafer, other suitable substrate materials, or a combination of the above, but not limited thereto. Next, a release layer (not shown) is optionally formed on the carrier. The material of the release layer may be a thermal tape. Next, the electronic component 200 is disposed on the release layer, so that the third surface 200*a* of the electronic component 200 faces the release layer, and the pad 210 of the electronic component 200 is in contact with the release layer. Next, the package structure 400 is formed on the release layer to surround the electronic component 200. Next, after being flipped upside down, the release layer and the carrier are removed by LLO, heating, or other suitable manners, for example, to expose the pad 210. Next, the second opening 410 is formed to be disposed on the package structure 400 on the third surface 200*a* and to be in contact and in connection with the electronic component 200. Next, the connector 100 is formed on the package structure 400 to electrically connect the at least one conductive structure 110 to the electronic component 200 through the pad 210, and cause the at least one first heat dissipation structure 120 to be in contact and in connection with the electronic component 200 through the second opening 410. Next, the heat sink 300 is formed on the second surface 100*b* of the connector 100. Next, the conductive terminal CT is formed on the fifth metal pad 1451 of the circuit layer 145, so that the electronic device 10*a* of this embodiment can be bonded to components such as an IC chip and/or a printed circuit board during subsequent manufacturing processes. So far, manufacturing of the electronic device 10*a* of this embodiment has been substantially completed.

Figure 3:
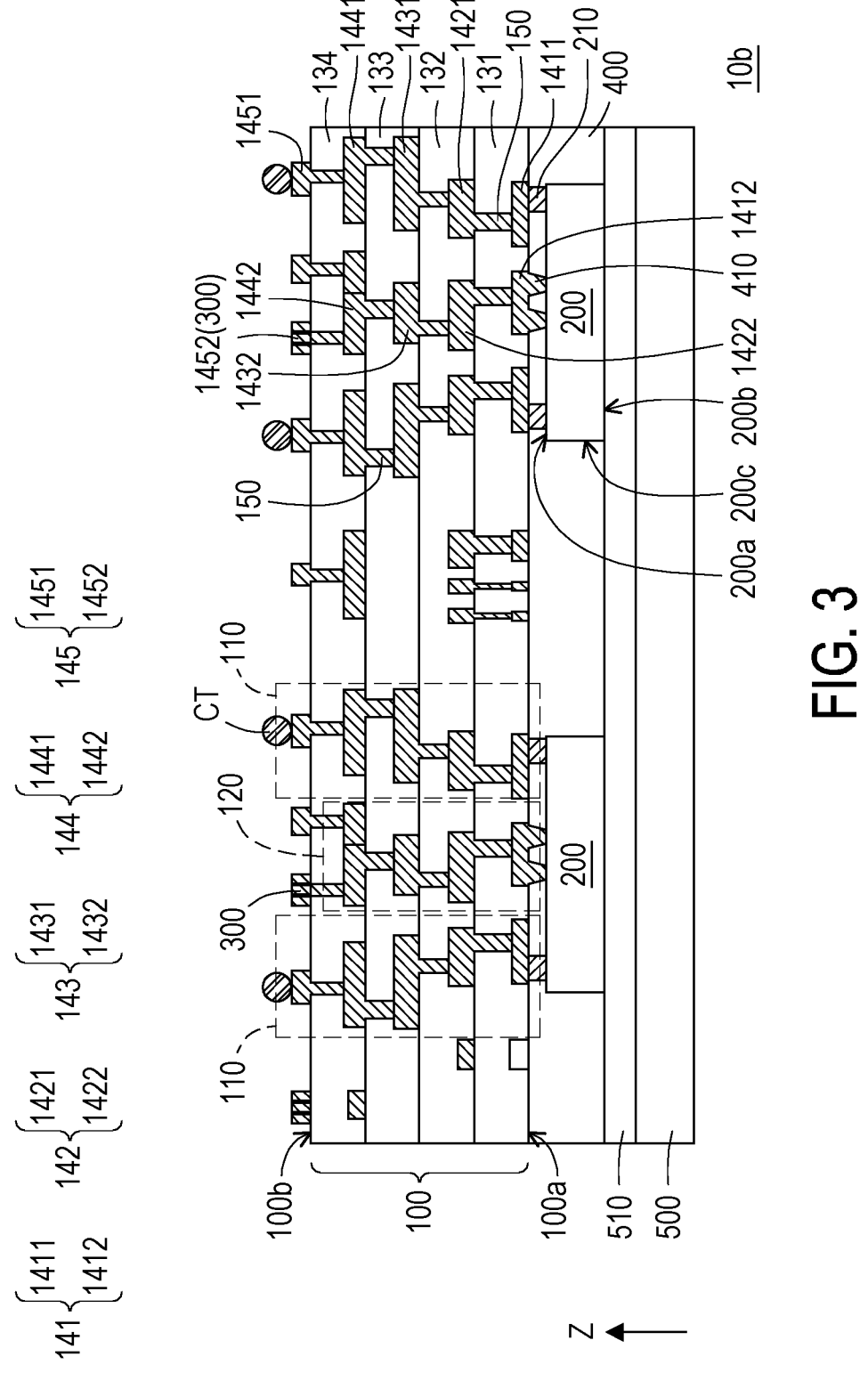
FIG. 3 is a schematic partial cross-sectional view of an electronic device according to another embodiment of the disclosure.

FIG. 3 is a schematic partial cross-sectional view of an electronic device according to another embodiment of the disclosure. With reference to FIG. 2 and FIG. 3 together, an electronic device 10*b* of this embodiment is similar to the electronic device 10*a* in FIG. 2, while the difference between them is that the electronic device 10*b* of this embodiment further includes a carrier 500 and a release layer 510.

Specifically, with reference to FIG. 3, in this embodiment, the release layer 510 is disposed on the carrier 500, the package structure 400 and the electronic component 200 are disposed on the release layer 510, and the connector 100 is disposed on the package structure 400. The connector 100 and the release layer 510 are respectively located on opposite sides of the package structure 400. The release layer 510 is located between the package structure 400 and the carrier 500. In some embodiments, it is also possible to not dispose the release layer depending on the requirements.

In this embodiment, the package structure 400 does not completely surround the electronic component 200, and the package structure 400 may expose the fourth surface 200*b* of the electronic component 200. Therefore, the release layer 510 may be in contact with the fourth surface 200*b* of the electronic component 200.

In addition, in this embodiment, a manufacturing method of the electronic device 10*b* may be a chip-first/face-up manufacturing method, including but not limited to the following. First, the carrier 500 is provided. The material of the carrier 500 may include silicon wafer, other suitable substrate materials, or a combination of the above, but not limited thereto. Next, the release layer 510 is optionally formed on the carrier 500. The material of the release layer 510 may be a thermal tape. Next, the electronic component 200 is disposed on the release layer 510, so that the third surface 200*a* of the electronic component 200 faces away from the release layer 510, and the fourth surface 200*b* of the electronic component 200 is in contact with the release layer 510. Next, the package structure 400 is formed on the release layer 510 to surround the electronic component 200. Next, a polishing process is performed on the package structure 400 to expose the pad 210 of the electronic component 200 from the package structure 400. Next, the second opening 410 is formed to be disposed on the third surface 200*a* of the package structure 400 and to expose part of the electronic component 200. Next, the connector 100 is formed on the package structure 400 to electrically connect the at least one conductive structure 110 to the electronic component 200 through the pad 210, and cause the first heat dissipation structure 120 to be in contact and in connection with the electronic component 200 through the second opening 410. Next, the heat sink 300 is formed on the second surface 100*b* of the connector 100. Next, the conductive terminal CT is formed on the fifth metal pad 1451 of the circuit layer 145, so that the electronic device 10*b* of this embodiment can be bonded to components such as an IC chip and/or a printed circuit board during subsequent manufacturing processes. So far, manufacturing of the electronic device 10*b* of this embodiment has been substantially completed.

Figure 4:
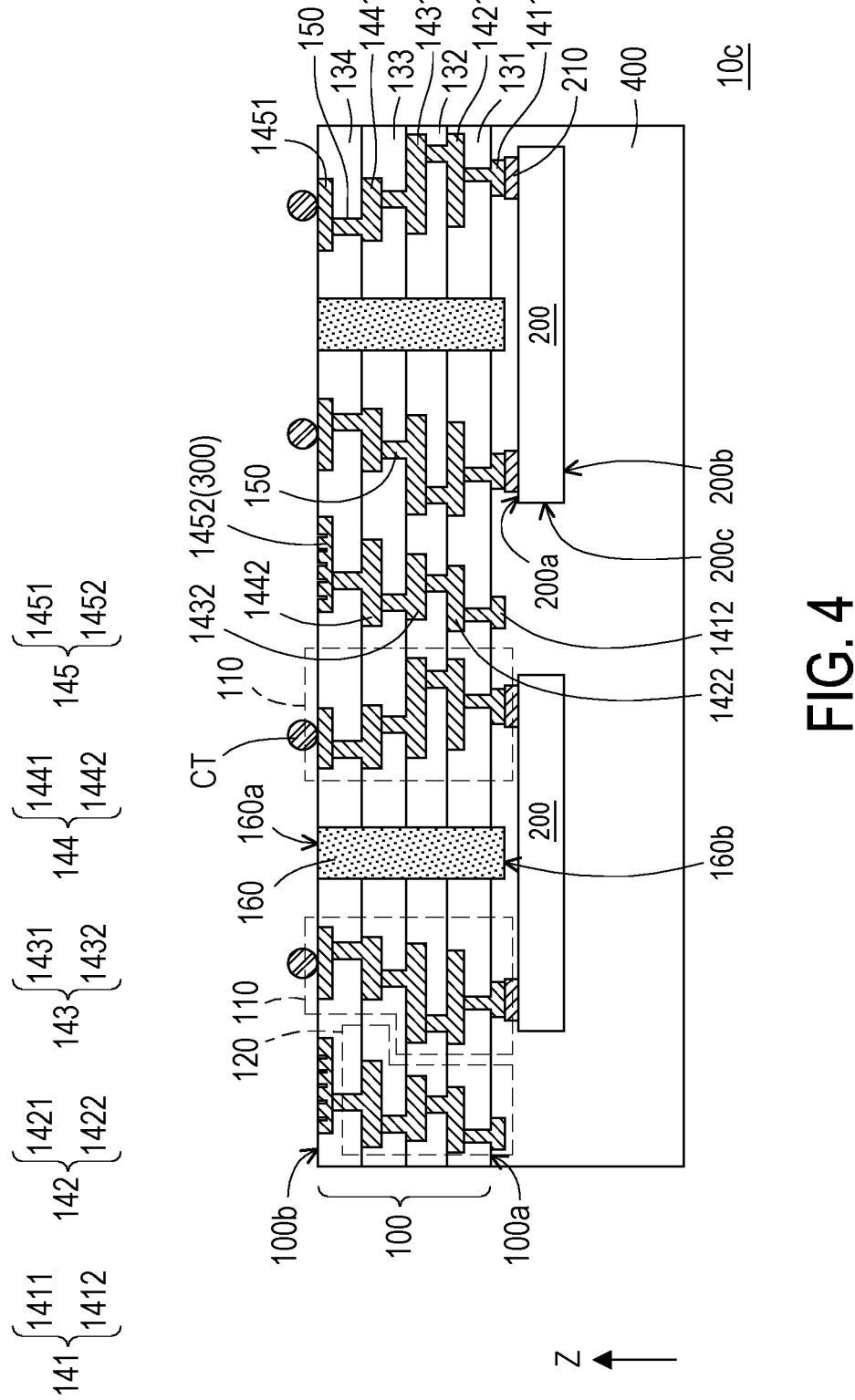
FIG. 4 is a schematic partial cross-sectional view of an electronic device according to another embodiment of the disclosure.

FIG. 4 is a schematic partial cross-sectional view of an electronic device according to another embodiment of the disclosure. With reference to FIG. 1 and FIG. 4 together, an electronic device 10*c* of this embodiment is similar to the electronic device 10 in FIG. 1, while the difference between them is that in the electronic device 10*c* of this embodiment, the connector 100 further includes at least one second heat dissipation structure 160.

Specifically, with reference to FIG. 4, one of the at least one second heat dissipation structure 160 may be overlapped with the electronic component 200 in the normal direction Z of the package structure 400. The at least one second heat dissipation structure 160 and the at least one conductive structure 110 are physically separated and electrically insulated from each other. The at least one second heat dissipation structure 160 may penetrate the insulating layer 131, the insulating layer 132, the insulating layer 133, the insulating layer 134, and part of the package structure 400 located between the first surface 100*a* and the electronic component 200.

In this embodiment, the at least one second heat dissipation structure 160 has a top surface 160*a* and a bottom surface 160*b* opposite to each other. The top surface 160*a* may be substantially aligned with the second surface 100*b* of the connector 100. In other words, the absolute value of the height difference between the top surface 160*a* and the second surface 100*b* in the normal direction Z of the package structure 400 is less than or equal to 3 millimeters (mm), but not limited thereto. The top surface 160*a* may be exposed to the exterior. The bottom surface 160*b* may be closer to the electronic component 200 than the top surface 160*a* is. A distance may exist between the bottom surface 160*b* and the electronic component 200 in the normal direction Z of the package structure 400. In other words, the second heat dissipation structure 160 is not in contact with the electronic component 200, but not limited thereto.

Moreover, in this embodiment, heat in the electronic component 200 and heat in the conductive structure 110 may not only be transferred to the exterior through the first heat dissipation structure 120 and the heat sink 300, but may also be transferred to the second heat dissipation structure 160 by thermal radiation and then transferred from the top surface 160*a* to the exterior by thermal convection, for example but not limited thereto. In other words, the second heat dissipation structure 160 may be adapted to transfer heat in the electronic component 200 and heat in the conductive structure 110 to the exterior. In addition, in this embodiment, by providing the second heat dissipation structure 160, the heat dissipation path can be further increased to further improve the overall heat dissipation efficiency. In this embodiment, the material of the second heat dissipation structure 160 may include polymer organic heat dissipation materials, other suitable heat dissipation materials, or a combination of the above materials, but not limited thereto.

Figure 5:
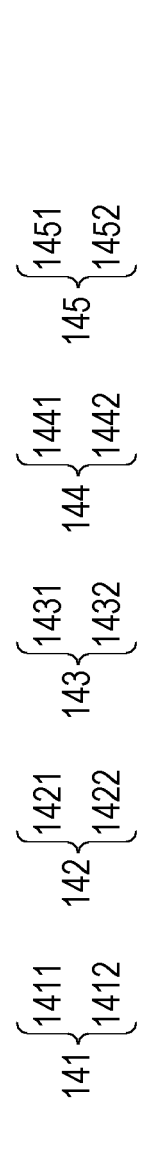
FIG. 5 is a schematic partial cross-sectional view of an electronic device according to another embodiment of the disclosure.

FIG. 5 is a schematic partial cross-sectional view of an electronic device according to another embodiment of the disclosure. FIG. 5 further shows metal lines for further description. With reference to FIG. 4 and FIG. 5 together, an electronic device 10*d* of this embodiment is similar to the electronic device 10*c* in FIG. 4, while the difference between them is that in the electronic device 10*d* of this embodiment, metal lines 171, 172, 173, 174, and 175 of the connector 100 extend to a second heat dissipation structure 162, and the second heat dissipation structure 162 does not exhibit electrical conductivity.

Specifically, with reference to FIG. 5, the metal line 171 may be disposed at the interface between the first metal pad 1411 and the insulating layer 131 and extend to the second heat dissipation structure 162. The metal line 172 may be disposed at the interface between the second metal pad 1421 and the insulating layer 132 and extend to the second heat dissipation structure 162. The metal line 173 may be disposed at the interface between the third metal pad 1431 and the insulating layer 133 and extend to the second heat dissipation structure 162. The metal line 174 may be disposed at the interface between the fourth metal pad 1441 and the insulating layer 134 and extend to the second heat dissipation structure 162. The metal line 175 may be disposed at the interface between the fifth metal pad 1451 and the second surface 100*b* and extend to the second heat dissipation structure 162. In other words, the metal lines 171, 172, 173, 174 and 175 may connect the at least one conductive structure 110 and the at least one second heat dissipation structure 162. Accordingly, heat in the conductive structure 110 may not only be transferred to the exterior through the first heat dissipation structure 120 and the heat sink 300, but may also be transferred to the second heat dissipation structure 162 through the metal lines 171, 172, 173, 174, and 175 by heat conduction, for example, and then transferred from a top surface 162a of the second heat dissipation structure 162 to the exterior by thermal convection, for example. In other words, in this embodiment, by providing the second heat dissipation structure 162, the heat dissipation path can be increased to improve the overall heat dissipation efficiency.

In this embodiment, a distance may exist between a bottom surface 162b of the second heat dissipation structure 162 and the electronic component 200 in the normal direction Z of the package structure 400. In other words, the second heat dissipation structure 162 is not in contact with the electronic component 200, but not limited thereto.

In this embodiment, the material of the metal lines 171, 172, 173, 174 and 175 may include titanium, copper, other suitable materials, or a combination of the above, but not limited thereto. In this embodiment, the material of the metal lines 171, 172, 173, 174 and 175 may function as a seed layer for metal disposition, but not limited thereto. The material of the second heat dissipation structure 162 may include polymer organic heat dissipation materials, other suitable heat dissipation insulating materials, or a combination of the above materials, but not limited thereto. Since the second heat dissipation structure 162 is a heat dissipation insulating material, the second heat dissipation structure 162 does not exhibit electrical conductivity, and the second heat dissipation structure 162 and the conductive structure 110 are electrically insulated from each other.

Figures 6A, 6B:
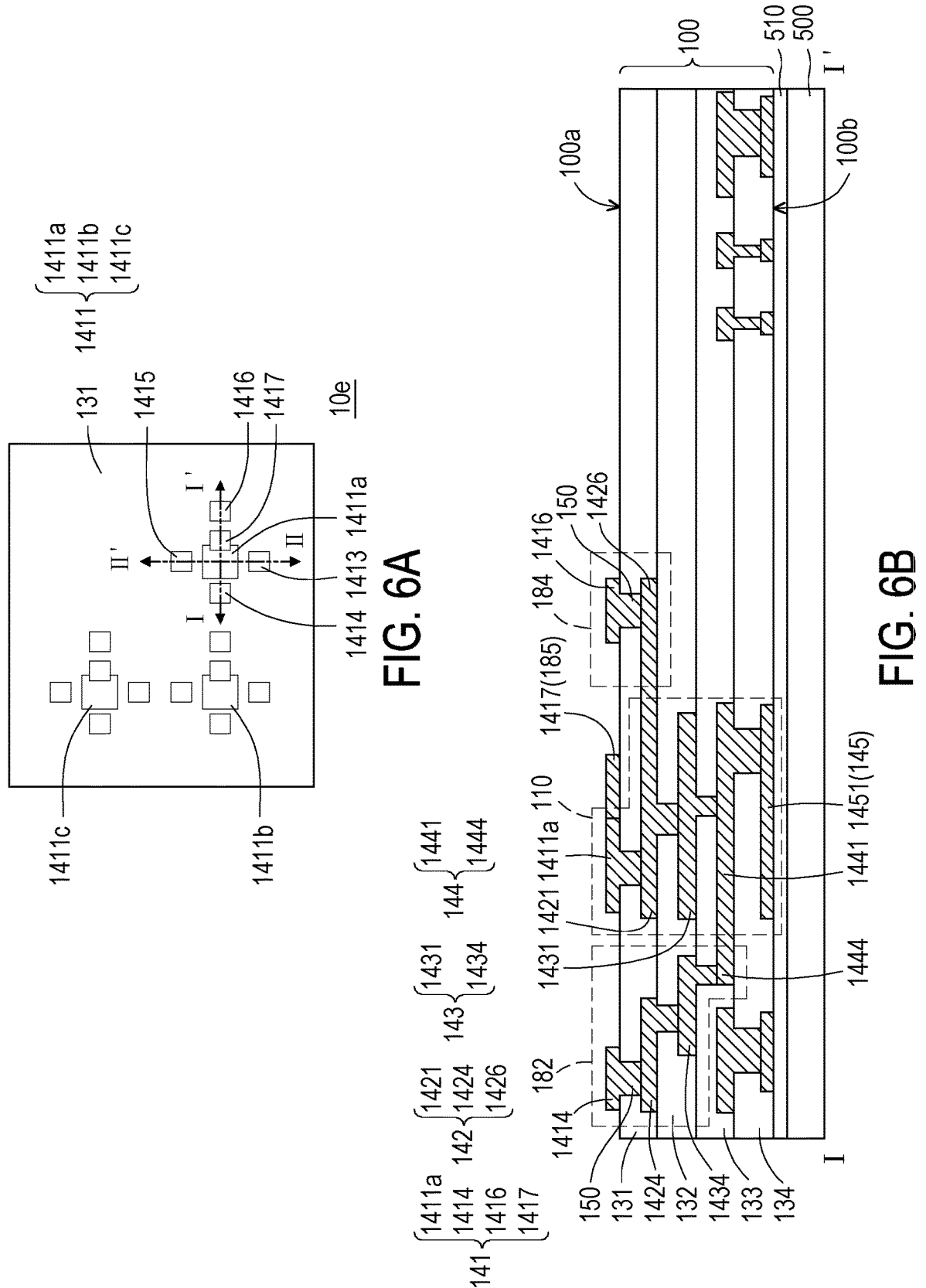
FIG. 6A is a schematic partial top view of an electronic device according to another embodiment of the disclosure.
FIG. 6B is a schematic cross-sectional view of the electronic device of FIG. 6A taken along section line I-I'.
Figure 6C:
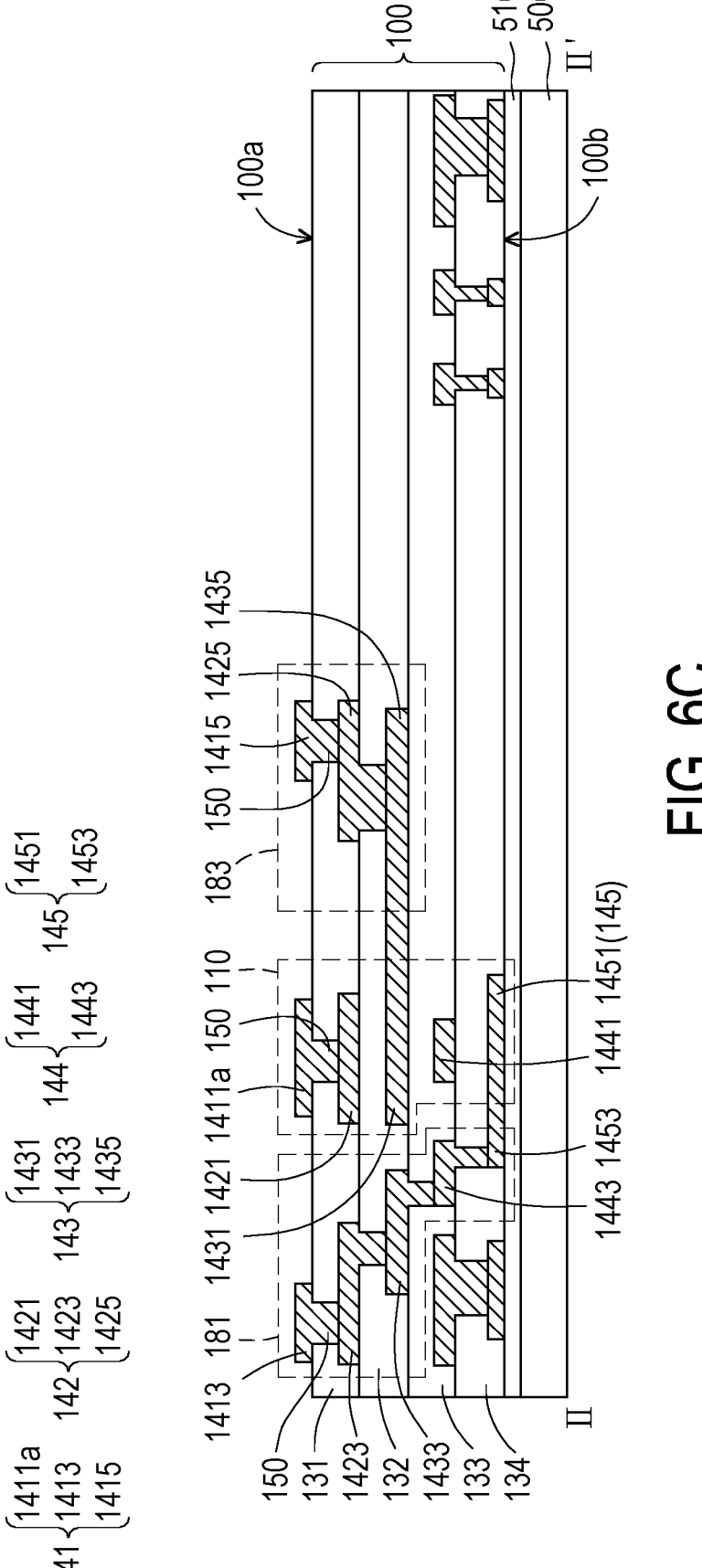
FIG. 6C is a schematic cross-sectional view of the electronic device of FIG. 6A taken along section line II-II'.

FIG. 6A is a schematic partial top view of an electronic device according to another embodiment of the disclosure. FIG. 6B is a schematic cross-sectional view of the electronic device of FIG. 6A taken along section line I-I'. FIG. 6C is a schematic cross-sectional view of the electronic device of FIG. 6A taken along section line II-II'. For the clarity of drawings and ease of description, FIG. 6A omits illustration of some elements in an electronic device 10e. With reference to FIG. 1 and FIG. 6A to FIG. 6C together, the electronic device 10e of this embodiment is similar to the electronic device 10 in FIG. 1, while the difference between them is that the electronic device 10e of this embodiment is similar to the structure of the electronic device 10 of FIG. 1 before the electronic component 200 is disposed. In other words, the electronic device 10e of this embodiment further includes the carrier 500 and the release layer 510. In addition, the connector 100 of this embodiment further includes at least one first test structures 181, 182, 183, 184, and 185.

Specifically, with reference to FIG. 6A to FIG. 6C, the release layer 510 is disposed on the carrier 500, and the connector 100 is disposed on the release layer 510. The first surface 100a of the connector 100 may be farther from the carrier 500 than the second surface 100b is. The circuit layer 145 in the connector 100 may be in contact with the release layer 510. The circuit layer 141 in the connector 100 may be exposed outside.

In this embodiment, the first metal pad 1411 may include a first metal pad 1411a, a first metal pad 1411b, and a first metal pad 1411c. The first metal pad 1411a, the first metal pad 1411b, and the first metal pad 1411c are electrically insulated from each other. The first metal pad 1411a, the first metal pad 1411b, and the first metal pad 1411c may be adapted to be bonded to the electronic component during subsequent manufacturing processes.

In this embodiment, the circuit layer 141 may further include a first test pad 1413, a first test pad 1414, a first test pad 1415, a first test pad 1416, and a first test pad 1417 that are physically separated from each other. As shown in FIG. 6A, the first test pad 1413, the first test pad 1414, the first test pad 1415, the first test pad 1416, and the first test pad 1417 may surround the first metal pad 1411a (or the first metal pad 1411b, or the first metal pad 1411c). The circuit layer 142 may further include a second test pad 1423, a second test pad 1424, a second test pad 1425, and a second test pad 1426 that are physically separated from each other. The circuit layer 143 may further include a third test pad 1433, a third test pad 1434, and a third test pad 1435 that are physically separated from each other. The circuit layer 144 may further include a fourth test pad 1443 and a fourth test pad 1444 that are physically separated from each other. The circuit layer 145 may further include a fifth test pad 1453.

In this embodiment, the first test structure 181 may include the first test pad 1413, the second test pad 1423, the third test pad 1433, the fourth test pad 1443, the fifth test pad 1453, and part of the first opening 150. The fifth test pad 1453 may be in contact with the fifth metal pad 1451 to electrically connect the first test structure 181 to the conductive structure 110.

The first test structure 182 may include the first test pad 1414, the second test pad 1424, the third test pad 1434, the fourth test pad 1444, and part of the first opening 150. The fourth test pad 1444 may be in contact with the fourth metal pad 1441 to electrically connect the first test structure 182 to the conductive structure 110.

The first test structure 183 may include the first test pad 1415, the second test pad 1425, the third test pad 1435, and part of the first opening 150. The third test pad 1435 may be in contact with the third metal pad 1431 to electrically connect the first test structure 183 to the conductive structure 110.

The first test structure 184 may include the first test pad 1416, the second test pad 1426, and part of the first opening 150. The second test pad 1426 may be in contact with the second metal pad 1421 to electrically connect the first test structure 184 to the conductive structure 110.

The first test structure 185 may include the first test pad 1417. The first test pad 1417 may be in contact with the first metal pad 1411 to electrically connect the first test structure 185 to the conductive structure 110.

In this embodiment, the first test structures 181, 182, 183, 184, and 185 may surround the conductive structure 110 for electrical inspection on the conductive structure 110, so as to ensure the quality of the conductive structure 110 before the electronic component is bonded to the connector 100. The electrical inspection may include an open circuit test and a short circuit test, for example.

For example, since the fourth test pad 1444 in the first test structure 182 may be in contact with the fourth metal pad 1441 of the conductive structure 110, and the second test pad 1426 in the first test structure 184 may be in contact with the second metal pad 1421 of the conductive structure 110, when two probes on a sensor are respectively in contact with the first test pad 1414 in the first test structure 182 and the first test pad 1416 in the first test structure 184, it can be known whether there is an open circuit between the second metal pad 1421 and the fourth metal pad 1441 in the conductive structure 110 through the signal sensed by the sensor. In some embodiments, it is also possible to select any two of the first test pad 1413, the first test pad 1414, the first test pad 1415, the first test pad 1416, and the first test pad 1417 to inspect whether there is an open circuit in the conductive structure 110.

For example, since the conductive structure 110 including the first metal pad 1411*a* and the conductive structure 110 including the first metal pad 1411*b* should be electrically insulated from each other, when two probes on a sensor are respectively in contact with the first test pad 1414 around the first metal pad 1411*a* and the first test pad 1416 around the first metal pad 1411*b*, it can be known whether there is a short circuit between the first metal pad 1411*a* and the first metal pad 1411*b* through the signal sensed by the sensor. In some embodiments, it is also possible to select other first test pads around the first metal pad 1411*a* and other first test pads around the first metal pad 1411*b* to inspect whether there is a short circuit between the first metal pad 1411*a* and the first metal pad 1411*b*.

Furthermore, in this embodiment, after the electrical inspection is completed to ensure that there is no open circuit or short circuit in the conductive structure 110, a surface of the first test pad (including the first test pad 1413, the first test pad 1414, the first test pad 1415, the first test pad 1416, and the first test pad 1417) away from the second surface 100*b* may also be etched into a fin-like structure by lithography etching or laser cutting to manufacture the first test pad (including the first test pad 1413, the first test pad 1414, the first test pad 1415, the first test pad 1416, and the first test pad 1417) into a heat sink or a heat dissipation fin to improve the overall heat dissipation efficiency. In other words, in this embodiment, by providing the first test structures 181, 182, 183, 184, and 185, not only can electrical inspections be performed, but the heat dissipation path can also be increased to improve the overall heat dissipation efficiency.

Figures 7A, 7B:
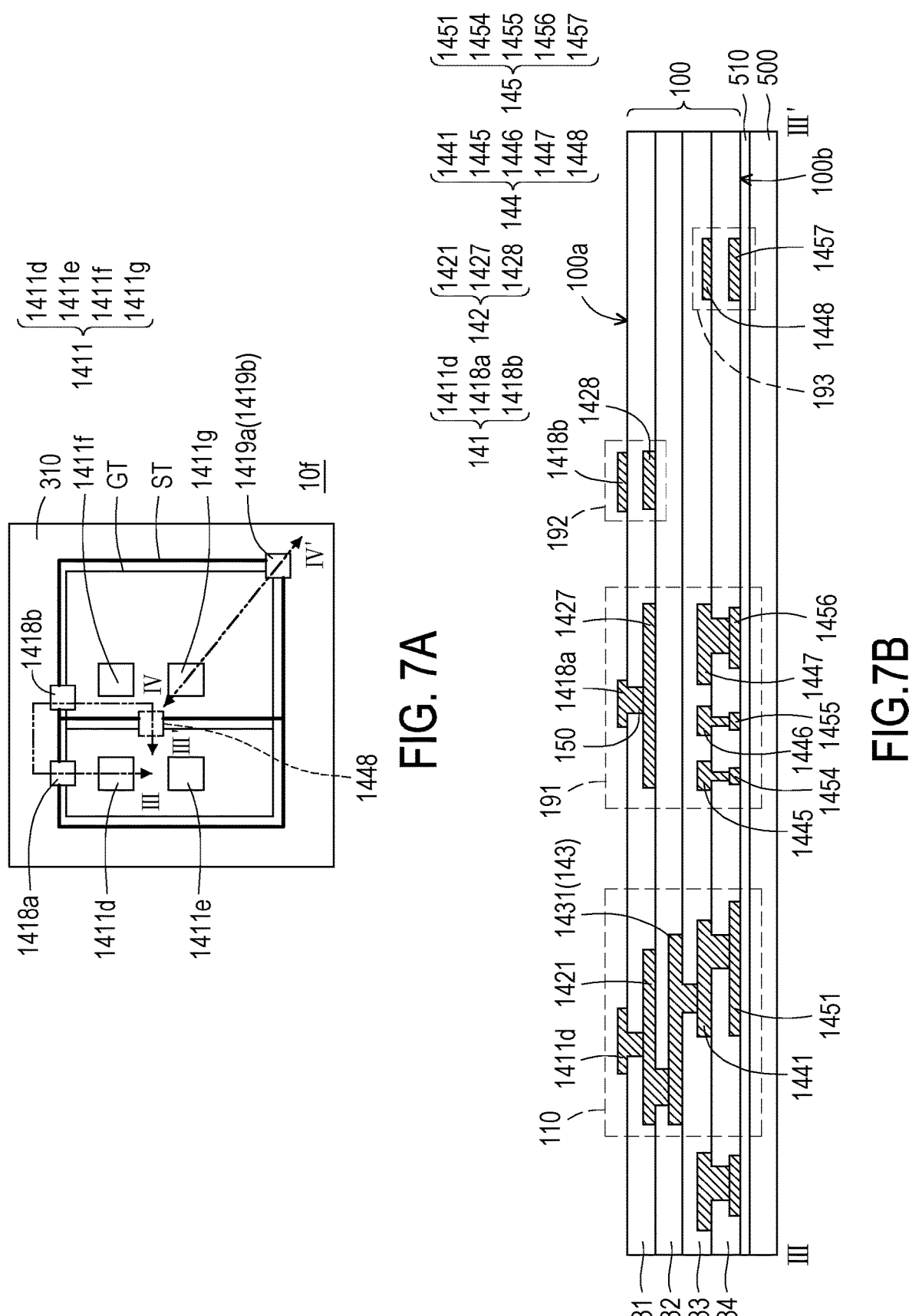
FIG. 7A is a schematic partial top view of an electronic device according to another embodiment of the disclosure.
FIG. 7B is a schematic cross-sectional view of the electronic device of FIG. 7A taken along section line III-III'.
Figure 7C:
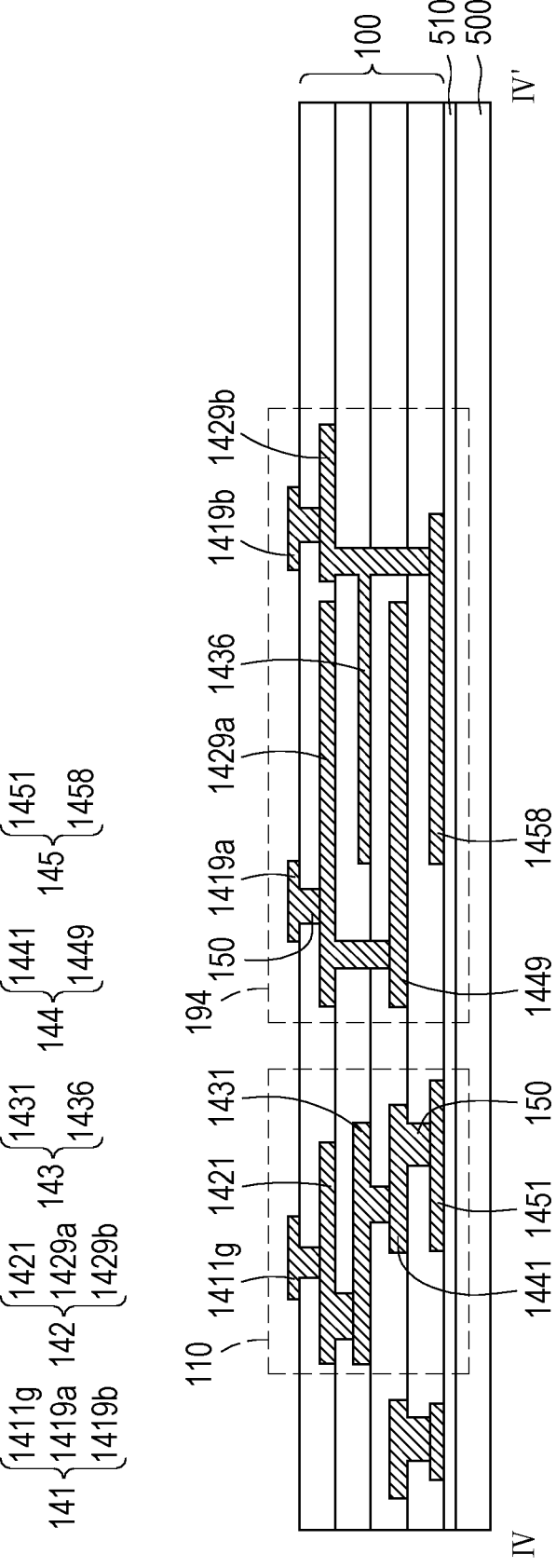
FIG. 7C is a schematic cross-sectional view of the electronic device of FIG. 7A taken along section line IV-IV'.

FIG. 7A is a schematic partial top view of an electronic device according to another embodiment of the disclosure. FIG. 7B is a schematic cross-sectional view of the electronic device of FIG. 7A taken along section line III-III'. FIG. 7C is a schematic cross-sectional view of the electronic device of FIG. 7A taken along section line IV-IV'. For the clarity of drawings and ease of description, FIG. 7A omits illustration of some elements in an electronic device 10*f*. With reference to FIG. 1 and FIG. 7A to FIG. 7C together, the electronic device 10*f* of this embodiment is similar to the electronic device 10 in FIG. 1, while the difference between them is that the electronic device 10*f* of this embodiment is similar to the structure of the electronic device 10 of FIG. 1 before the electronic component 200 is disposed. In other words, the electronic device 10*f* of this embodiment further includes the carrier 500 and the release layer 510. In addition, the connector 100 of this embodiment further includes at least one second test structures 191, 192, 193, and 194, a signal trace ST, and a ground trace GT.

Specifically, with reference to FIG. 7A to FIG. 7C, the release layer 510 is disposed on the carrier 500, and the connector 100 is disposed on the release layer 510. The first surface 100*a* of the connector 100 may be farther from the carrier 500 than the second surface 100*b* is. The circuit layer 145 in the connector 100 may be in contact with the release layer 510. The circuit layer 141 in the connector 100 may be exposed outside.

In this embodiment, the first metal pad 1411 may include a first metal pad 1411*d*, a first metal pad 1411*e*, a first metal pad 1411*f*, and a first metal pad 1411*g*. The first metal pad 1411*d*, the first metal pad 1411*e*, the first metal pad 1411*f*, and the first metal pad 1411*g* are electrically insulated from each other. The first metal pad 1411*d*, the first metal pad 1411*e*, the first metal pad 1411*f*, and the first metal pad

1411*g* may be adapted to be bonded to the electronic component during subsequent manufacturing processes.

In this embodiment, the circuit layer 141 may further include a first test pad 1418*a*, a first test pad 1418*b*, a first test pad 1419*a*, and a first test pad 1419*b* that are physically separated from each other. The circuit layer 142 may further include a second test pad 1427, a second test pad 1428, a second test pad 1429*a*, and a second test pad 1429*b* that are physically separated from each other. The circuit layer 143 may further include a third test pad 1436. The circuit layer 144 may further include a fourth test pad 1445, a fourth test pad 1446, a fourth test pad 1447, a fourth test pad 1448, and a fourth test pad 1449 that are physically separated from each other. The circuit layer 145 may further include a fifth test pad 1454, a fifth test pad 1455, a fifth test pad 1456, a fifth test pad 1457, and a fifth test pad 1458.

In this embodiment, the second test structure 191 may include the first test pad 1418*a*, the second test pad 1427, part of the insulating layer 132, part of the insulating layer 133, the fourth test pad 1445, the fourth test pad 1446, the fourth test pad 1447, the fifth test pad 1454, the fifth test pad 1455, the fifth test pad 1456, and part of the first opening 150. The second test structure 191 is a capacitive element. The first test pad 1418*a* and the second test pad 1427 together are the upper electrode in the capacitive element. The fourth test pad 1445, the fourth test pad 1446, the fourth test pad 1447, the fifth test pad 1454, the fifth test pad 1455, and the fifth test pad 1456 together are the lower electrode in the capacitive element. Part of the insulating layer 132 and part of the insulating layer 133 together are the insulating layer disposed between the upper electrode and the lower electrode in the capacitive element.

The second test structure 192 may include the first test pad 1418*b*, part of the insulating layer 131, and the second test pads 1428. The second test structure 192 is a capacitive element. The first test pad 1418*b* is the upper electrode in the capacitive element. The second test pad 1428 is the lower electrode in the capacitive element. Part of the insulating layer 131 is the insulating layer disposed between the upper electrode and the lower electrode in the capacitive element.

The second test structure 193 may include the fourth test pad 1448, part of the insulating layer 134, and the fifth test pad 1457. The second test structure 193 is a capacitive element. The fourth test pad 1448 is the upper electrode in the capacitive element. The fifth test pad 1457 is the lower electrode in the capacitive element. Part of the insulating layer 134 is the insulating layer disposed between the upper electrode and the lower electrode in the capacitive element.

The second test structure 194 may include the first test pad 1419*a*, the first test pad 1419*b*, the second test pad 1429*a*, the second test pad 1429*b*, part of the insulating layer 132, the third test pad 1436, part of the insulating layer 133, the fourth test pad 1449, part of the insulating layer 134, the fifth test pad 1458, and part of the first opening 150. The second test structure 194 is a capacitive element. The first test pad 1419*a*, the second test pad 1429*a*, and the fourth test pad 1449 together are the upper electrode or the lower electrode in the capacitive element. The first test pad 1419*b*, the second test pad 1429*b*, the third test pad 1436, and the fifth test pad 1458 together are the upper electrode or the lower electrode in the capacitive element. Part of the insulating layer 132, part of the insulating layer 133, and part of the insulating layer 134 may respectively be the insulating layers disposed between the upper electrode and the lower electrode in the capacitive element.

In this embodiment, since the second test structure 191, the second test structure 192, the second test structure 193, and the second test structure 194 are capacitive elements, an insulator test may be performed by inspecting the capacitance value of the capacitive element to determine whether there is peeling, improper thickness, or warping of the insulating layer in the connector 100 before the electronic component is bonded to the connector 100.

In addition, in this embodiment, the signal trace ST and the ground trace GT are electrically insulated from each other. The ground trace GT may be electrically connected to the fourth test pad 1445, the fourth test pad 1446, the fourth test pad 1447, the fifth test pad 1454, the fifth test pad 1455, the fifth test pad 1456, the second test pad 1428, the fifth test pad 1457, the first test pad 1419*a*, the second test pad 1429*a*, and the fourth test pad 1449. The signal trace ST may be electrically connected to the first test pad 1418*a*, the second test pad 1427, the first test pad 1418*b*, the fourth test pad 1448, the first test pad 1419*b*, the second test pad 1429*b*, the third test pad 1436, and the fifth test pad 1458. In other words, the signal trace ST and the ground trace GT may connect at least one capacitive element (i.e., the second test structure 191, the second test structure 192, the second test structure 193, and the second test structure 194) in parallel to generate an equivalent capacitance with a relatively great capacitance value. Therefore, in this embodiment, the insulator test is also performed by inspecting the equivalent capacitance of the capacitive elements to determine whether there is peeling, improper thickness, or warping of the insulating layer in the connector 100.

Furthermore, in this embodiment, after the insulator test is completed to ensure that there is no peeling, improper thickness, or warping of the insulating layer in the connector 100, a surface of the first test pad (including the first test pad 1418*a*, the first test pad 1418*b*, the first test pad 1419*a*, and the first test pad 1419*b*) away from the first surface 100*a* may also be etched into a fin-like structure by lithography etching or laser cutting to manufacture the first test pad (including the first test pad 1418*a*, the first test pad 1418*b*, the first test pad 1419*a*, and the first test pad 1419*b*) into a heat sink or a heat dissipation fin to improve the overall heat dissipation efficiency. In other words, in this embodiment, by providing the second test structures 191, 192, 193, and 194, not only can insulator tests be performed, but the heat dissipation path can also be increased to improve the overall heat dissipation efficiency.

In summary of the foregoing, in the electronic device and the manufacturing method thereof according to the embodiments of the disclosure, by providing the first heat dissipation structure and the heat sink, the heat dissipation path can be increased to improve the overall heat dissipation efficiency. Since the configuration of the heat sink is integrated in the connector, relatively large heat dissipation devices or heat dissipation plates are not required to be additionally disposed at other locations, reducing the overall size (e.g., thickness) of the electronic device. In addition, by providing the second heat dissipation structure, the heat dissipation path can be further increased to further improve the overall heat dissipation efficiency. Furthermore, by providing the first test structure and the second test structure, not only can electrical inspections and insulator tests be respectively performed, but the heat dissipation path can also be increased to improve the overall heat dissipation efficiency.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
a connector having a first surface, a second surface opposite to the first surface, at least one conductive structure and at least one first heat dissipation structure, wherein the at least one conductive structure and the at least one first heat dissipation structure are physically separated and electrically insulated from each other;
an electronic component disposed on the first surface, wherein the electronic component is bonded to the at least one conductive structure through a pad and electrically connected to the at least one conductive structure;
a heat sink disposed on the second surface and connected to the at least one first heat dissipation structure, wherein the heat sink and the electronic component are disposed on opposite sides of the connector; a package structure disposed on the connector and surrounding the electronic component; and
a conductive terminal disposed on the second surface and electrically connected to the at least one conductive structure, wherein the conductive terminal and the electronic component are disposed on opposite sides of the connector,
wherein the package structure contacts the electronic component,
wherein in a normal direction of the package structure, the electronic component overlaps with the at least one conductive structure and the at least one first heat dissipation structure,
wherein an opening of the package structure is located between the first surface of the connector and the electronic component, and the at least one first heat dissipation structure extends through the opening and is in contact with the electronic component.

2. The electronic device according to claim 1, wherein a surface of the heat sink is substantially aligned with the second surface of the connector.

3. The electronic device according to claim 2, wherein the heat sink is embedded in the connector and exposed outside the second surface.

4. The electronic device according to claim 1, wherein the at least one first heat dissipation structure is adapted to transfer heat in the electronic component and heat in the at least one conductive structure to the heat sink, and the heat sink is adapted to transfer heat to an exterior.

5. The electronic device according to claim 1, wherein the heat sink is connected to the electronic component through the at least one first heat dissipation structure.

6. The electronic device according to claim 5, wherein the at least one first heat dissipation structure is in contact with the electronic component.

7. The electronic device according to claim 1, wherein the connector comprises at least one capacitive element.

8. The electronic device according to claim 1, wherein the connector further comprises:
at least one second heat dissipation structure physically separated and electrically insulated from the at least one conductive structure.

9. The electronic device according to claim 8, wherein a top surface of the at least one second heat dissipation structure is substantially aligned with the second surface of the connector.

10. The electronic device according to claim 8, wherein one of the at least one second heat dissipation structure is overlapped with the electronic component in a normal direction of the package structure.

11. The electronic device according to claim 8, wherein the at least one second heat dissipation structure is adapted to transfer heat in the electronic component and heat in the at least one conductive structure to an exterior.

12. The electronic device according to claim 1, wherein the connector further comprises:

at least one second heat dissipation structure physically separated from the at least one conductive structure; and a metal line connecting the at least one conductive structure and the at least one second heat dissipation structure.

13. The electronic device according to claim 1, wherein the connector is a redistribution layer.

14. The electronic device according to claim 1, wherein the heat sink is a heat dissipation fin.

15. The electronic device according to claim 1, wherein the connector further comprises:

at least one first test structure electrically connected to the at least one conductive structure, respectively.

16. The electronic device according to claim 15, wherein a first test pad of the at least one first test structure is manufactured into a heat dissipation fin after the at least one first test structure performs electrical inspection on the at least one conductive structure.

17. The electronic device according to claim 1, wherein the connector further comprises at least one second test structure, and a first test pad of the at least one second test structure is manufactured into a heat dissipation fin after the at least one second test structure performs electrical inspection on an insulating layer of the connector.

18. A manufacturing method of an electronic device, the method comprising:

forming a connector, wherein the connector has a first surface, a second surface opposite to the first surface, at least one conductive structure and at least one first heat dissipation structure, and the at least one conductive structure and the at least one first heat dissipation structure are physically separated and electrically insulated from each other;

disposing an electronic component on the first surface to be electrically connected to the at least one conductive structure, wherein the electronic component is bonded to the at least one conductive structure through a pad;

forming a heat sink on the second surface to be connected to the at least one first heat dissipation structure, wherein the heat sink and the electronic component are disposed on opposite sides of the connector; forming a package structure on the connector to surround the electronic component; and forming a conductive terminal on the second surface to be electrically connected to the at least one conductive structure, wherein the conductive terminal and the electronic component are disposed on opposite sides of the connector, wherein the package structure contacts the electronic component, wherein in a normal direction of the package structure, the electronic component overlaps with the at least one conductive structure and the at least one first heat dissipation structure, wherein an opening of the package structure is located between the first surface of the connector and the electronic component, and the at least one first heat dissipation structure extends through the opening and is in contact with the electronic component.

* * * * *